United States Patent [19]

Kung et al.

[11] Patent Number: 5,343,422

[45] Date of Patent: Aug. 30, 1994

[54] NONVOLATILE MAGNETORESISTIVE STORAGE DEVICE USING SPIN VALVE EFFECT

[75] Inventors: Kenneth T. Kung, San Jose; Denny D. Tang, Saratoga; Po-Kang Wang, San Jose, all of Calif.

[73] Assignee: International Business Machines Corporation, Armonk, N.Y.

[21] Appl. No.: 21,413

[22] Filed: Feb. 23, 1993

[51] Int. Cl.$^5$ ............................................. G11C 11/15
[52] U.S. Cl. .................................... 365/173; 365/158; 360/113
[58] Field of Search ................. 365/158, 173; 360/113

[56] References Cited

U.S. PATENT DOCUMENTS

| | | | |
|---|---|---|---|
| 3,623,038 | 11/1971 | Franklin et al. | 365/173 |
| 3,701,983 | 10/1972 | Franklin et al. | 365/173 |
| 4,547,866 | 10/1985 | Lutes et al. | 365/173 |
| 4,857,418 | 8/1989 | Schuetz | 365/158 X |
| 5,159,513 | 10/1992 | Dieny et al. | 360/113 |
| 5,173,873 | 12/1992 | Wu et al. | 365/173 |

OTHER PUBLICATIONS

"Enhanced Magnetoresistance in Layered Magnetic Structures with Antiferromagnetic Interlayer Exchange", Physical Review B of American Physical Society, vol. 39, No. 7, p. 4828 (1989), pp. 4828-4830.
"Memory Implications of the Spin-Valve Effect in Soft Multilayers," A. V. Pohm and C. S. Comstock, Journal of Appl. Phys. 69(8) Apr. 15, 1991, pp. 5760-5762.
"Quadrupled nondestrictive Outputs from Magnetoresistive Memory Cells Using Reversed Word Fields", A. V. Pohm and C. S. Comstock, Journal of Appl. Phys. 67(9) May 1, 1990 pp. 4881-4883.

Primary Examiner—Eugene R. LaRoche
Assistant Examiner—Son Mai
Attorney, Agent, or Firm—Henry E. Otto, Jr.

[57] ABSTRACT

A nonvolatile magnetoresistive (MR) storage device comprising a plurality of MR storage elements, each comprising a substrate and a multilayered structure including two thin film layers of ferromagnetic material separated by a thin layer of nonmagnetic metallic conducting material. The magnetization easy axis of both ferromagnetic layers in each storage element is oriented substantially lengthwise of the storage elements and substantially parallel to the direction of an applied sense current. The magnetization direction of one of the ferromagnetic layers is fixed in a direction substantially lengthwise of the storage elements, and the magnetization direction of the other layer is free to switch between two digital states in which the magnetization is substantially parallel or substantially antiparallel to the magnetization direction in the one layer.

15 Claims, 4 Drawing Sheets

NONVOLATILE MAGNETORESISTIVE STORAGE DEVICE USING SPIN VALVE EFFECT

This invention relates to high-performance, nonvolatile storage devices, and more particularly to a nonvolatile magnetic random access storage device using magnetoresistive storage elements with a spin valve configuration.

BACKGROUND OF THE INVENTION

The following references are considered by Applicants to be most pertinent to the present invention:

[A] Commonly assigned U.S. Pat. No. 5,159,513 discloses a magnetoresistive (MR) sensor which utilizes the spin valve effect. The sensor comprises a rectangular multilayered structure deposited on a glass or other suitable substrate. First and second ferromagnetic layers are separated by a thin copper spacer layer. The magnetization of the first layer is fixed in a direction across the width of the sensor by use of a hard magnetic material as the first layer or, if preferred, by use of an antiferromagnetic layer to pin the first layer by exchange coupling. The magnetization of the second layer is normally in a direction along the length of the sensor, but is free to rotate through an angle determined by the magnitude of the magnetic field being sensed. Hence, the sensor is an analog type device.

[B] A paper entitled "Enhanced Magnetoresistance in Layered Magnetic Structures With Antiferromagnetic Interlayer Exchange," published in Physical Review B of the American Physical Society, Vol. 39, No. 7, p. 4828, (1989), notes that antiferromagnetic coupling between these layers results in a strong increase in magnetoresistance effect due to antiparallel alignment of the magnetizations in the ferromagnetic film layers, making this attractive for applications such as MR field sensors.

[C] A paper entitled "Memory Implications of the Spin-Valve Effect in Soft Multilayers," published in J. Appl. Physics 69(8), Apr. 15, 1991, at p. 5760 et seq., describes a MR storage element that also has certain deficiencies hereinafter to be more fully described.

There is a need for a nonvolatile magnetic storage device which overcomes these deficiencies, in that it (1) achieves a direct current read without requiring state interrogation, (2) utilizes the full $\delta R/R$ of the magnetic layers to achieve high sensitivity, (3) improves read access time by obviating the need for lock-in detection, (4) enables reduction in the size of the spin valve cell primarily by reducing the width of the MR storage element and thus increases the signal level, and (5) enables high-speed write and erase operations.

SUMMARY OF THE INVENTION

A nonvolatile magnetoresistive storage element is described comprising a substrate and a rectangular multilayered structure deposited thereon which includes two layers of ferromagnetic material separated by a layer of nonmagnetic metallic conducting material. The magnetization easy axis of both ferromagnetic layers is oriented substantially lengthwise of the storage element. The magnetization of one of the ferromagnetic layers is fixed in one direction substantially lengthwise of the storage element, and the magnetization of the other ferromagnetic layer is free to change direction between substantially parallel and substantially antiparallel to the fixed direction in response to an applied magnetic field.

The width of the storage element is less than the width of magnetic domain walls of the layers of the multilayered structure.

The applied magnetic fields switch it between two states representing a logical "1" or a logical "0" according to whether the magnetization directions of the ferromagnetic layers are parallel or antiparallel, respectively. The magnetization direction of the one ferromagnetic layer may be fixed by exchange coupling with an antiferromagnetic layer; or, if preferred, this may be accomplished by use for the one layer of a hard magnetic material having a greater coercivity than the coercivity than the coercivity of said other layer, or sufficiently high anisotropy to retain its magnetization during state switching operations.

DESCRIPTION OF PRIOR ART

Figure 1A:
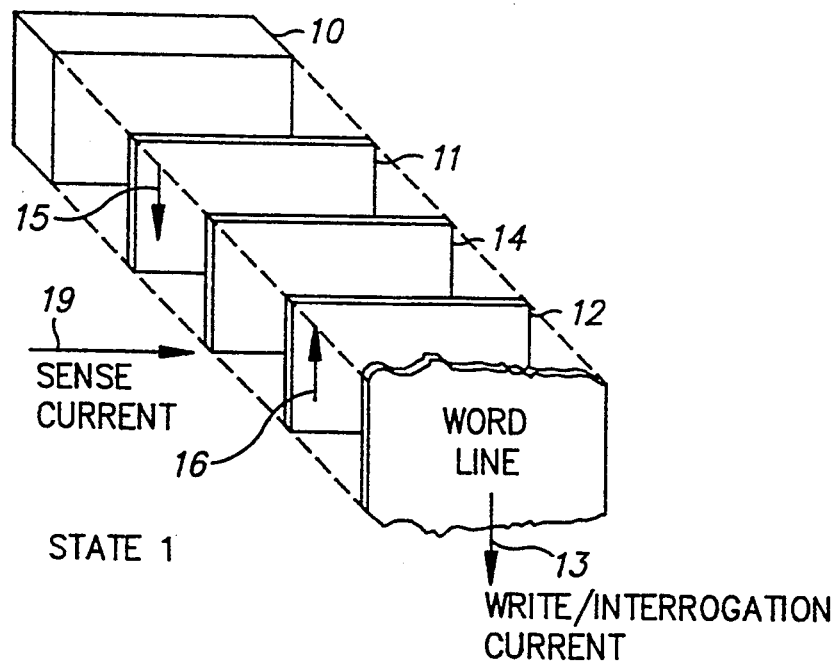
FIGS. 1A and 1B are exploded perspective views depicting the "1" and "0" information states of the last cited prior art MR storage element.
Figure 1B:
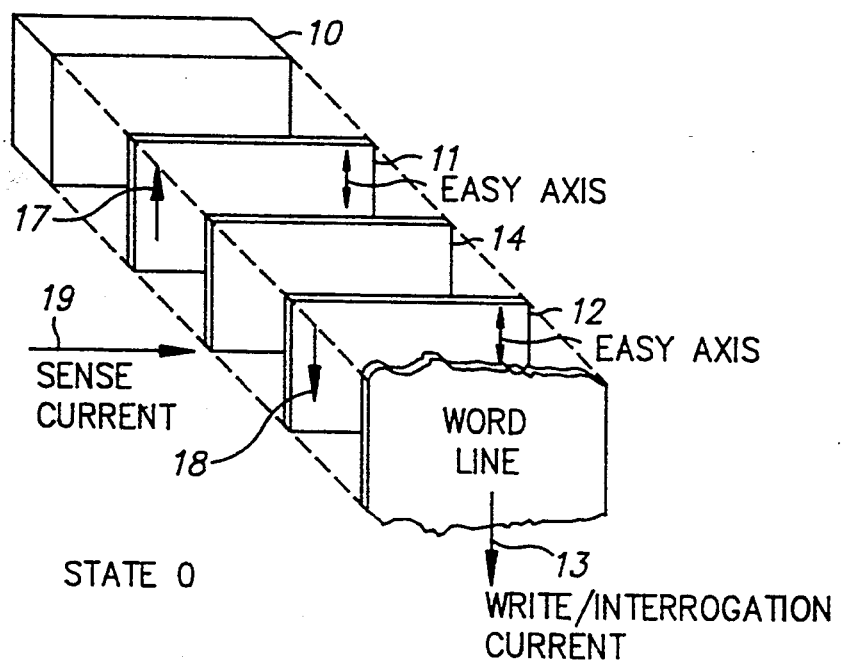

FIGS. 1A and 1B depict an MR storage element of the type described in Reference [C]. It comprises two ferromagnetic layers 11, 12, which are separated by a thin nonmagnetic spacer layer 14. Note that the magnetization directions in the magnetic layers 11, 12 as indicated by arrows 15, 16 (FIG. 1A) are antiparallel; that these magnetization directions both change substantially 180°, as indicated by arrows 17, 18 (FIG. 1B) in response to a write current; and that the easy access anisotropy is perpendicular to the direction of the sense current, as indicated by arrow 19.

Since the two magnetic states give identical direct current outputs, a longitudinal field provided by write-/interrogation current 13 is required to dynamically interrogate the MR storage device to determine the existing state. To prevent destruction of the stored information as a result of switching of the states during reading, only a small rotation of the magnetization is permissible. This results in poor utilization of the $\delta R/R$ of magnetic sensor layers.

For example, in a one megabit array, the difference in rotation between the two states during a read operation corresponds to a $\delta R/R$ of 0.22%, which is less than 1/10 of the 2.5% total $\delta R/R$ of the multilayered structure. Also, the magnitude of the sense current must be limited to avoid inducing a change in state.

The combination of poor $\delta R/R$ utilization and low sense current results in low sensitivity, requiring slow "lock-in" detection and, hence, a slow read access time.

This configuration is not extendable to very high density storage devices. This is because the shape anisotropy and edge curling domain walls hinder the transverse orientation of the magnetization. As a result, the width of the storage element cannot be made too narrow. If the size of the spin valve cell is reduced to reduce its width, the consequent reduction in length of the storage element would further reduce the already low signal level.

DESCRIPTION OF THE PREFERRED EMBODIMENTS

Figure 2A:
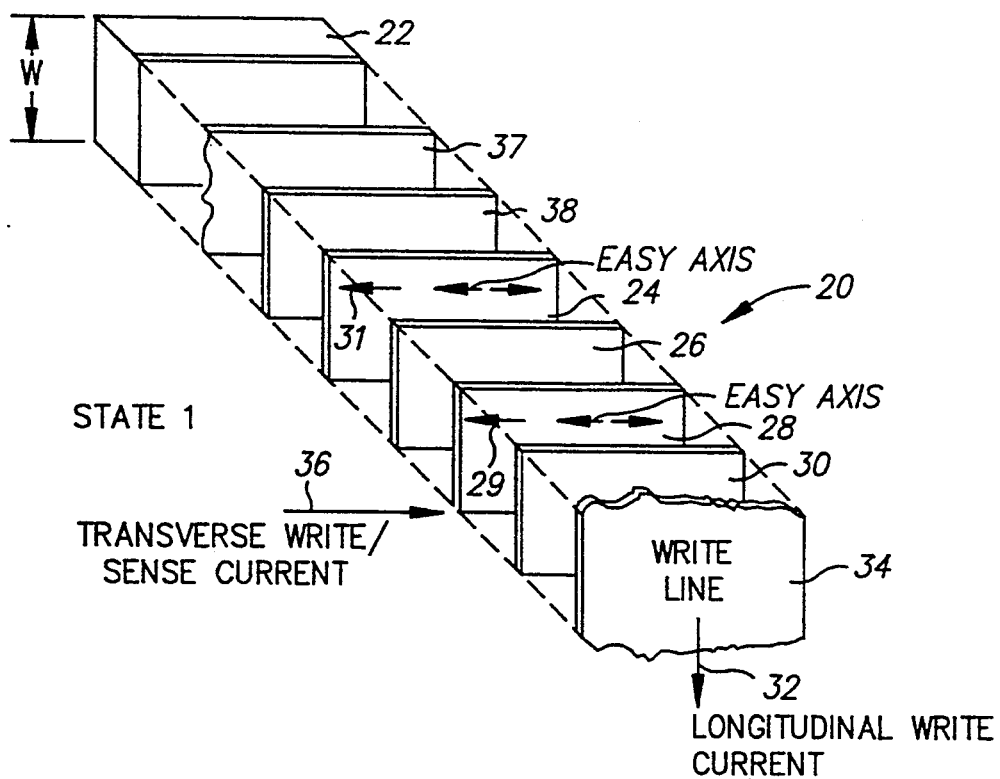
FIGS. 2A and 2B are exploded perspective views depicting the "1" and "0" information states of an MR storage element embodying the invention.
Figure 2B:
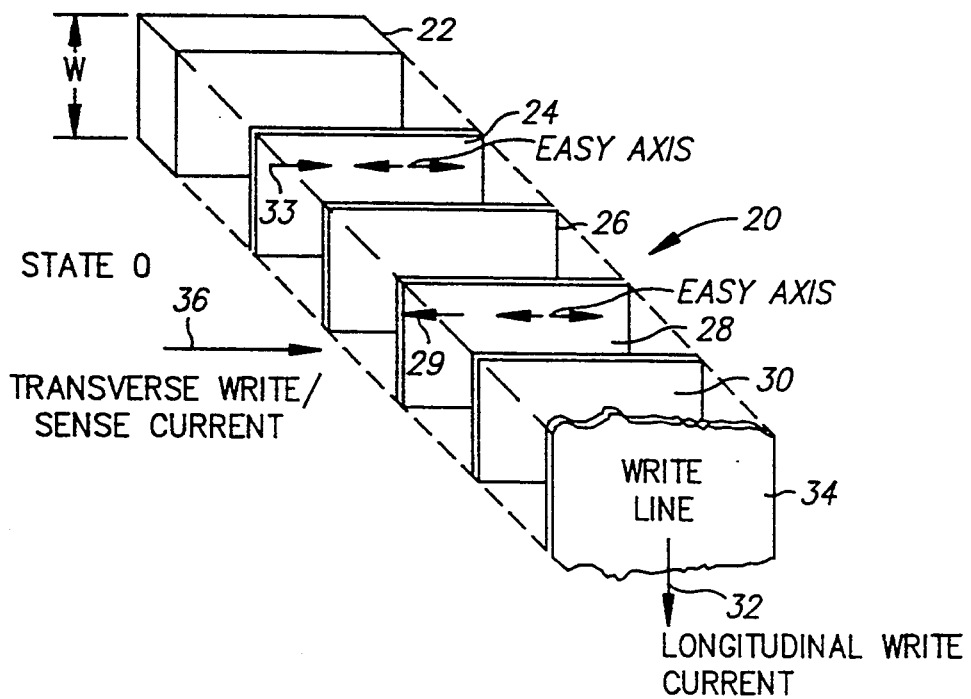

These deficiencies are overcome by applicants' novel spin valve cell configuration. As illustrated in FIGS. 2A and 2B, storage element 20 embodying the invention comprises a suitable substrate 22, such as glass, ceramic or a semiconductor, upon which are deposited a first thin film layer 24 of soft ferromagnetic material, a thin film layer 26 of a nonmagnetic metallic conducting material such as copper, and a second thin film layer 28 of ferromagnetic material.

Note that the storage element 20 is rectangular, and that the easy axis of magnetization is along the length of the storage element. The magnetization direction of magnetic layer 28 is fixed (see arrow 29) to be parallel to the longitudinal dimension of the storage element, such as by exchange coupling with an antiferromagnetic layer 30. However, if preferred, the layer 30 may be eliminated provided layer 28 is of a sufficiently hard magnetic material or has sufficiently high anisotropy to retain its magnetization during state switching operations.

The magnetization of layer 24 is constrained by the uniaxial anisotropy and the shape geometry to lay in the longitudinal direction of element 20, either parallel (see arrow 31, FIG. 2A) or antiparallel (see arrow 33, FIG. 2B) to the fixed direction of magnetization of the layer 28. Switching of the storage element 20 between the "1" state (FIG. 2A) and the "0" state (FIG. 2B) is accomplished by simultaneously applying a transverse field and a longitudinal field to element 20. The longitudinal field is induced by a longitudinal write current 32 in a write line 34 provided by a conductor that extends orthogonal to the length of the storage element 20. The transverse field is induced by a transverse write/sense current 36 flowing lengthwise through the element 20. If desired to increase stability by enhancing the transverse field, additional transverse write/sense current may be provided via an optional separate conductor 37 that extends lengthwise through the storage element and is interposed between substrate 22 and an insulating layer 38 that contacts layer 24, as shown only in FIG. 2A.

To ensure that the storage element 20 will exhibit only the two binary states, its short dimension W (FIGS. 2A and 2B) should be smaller than the width of the magnetic domain walls. With a typical spin valve film thickness of 50–90 Å, the Neel wall width (i.e., the width of a magnetic domain wall in a thin ferromagnetic film) is about 1.2 $\mu$m indicating that a storage element width W of 1 $\mu$m or less should ensure viable transitions between the states. In an actual test, it was shown that a storage element having a 0.75 $\mu$m width provided a single sharp transition between the parallel and antiparallel states. Electrical resistance is at a minimum when the magnetization of layer 24 is parallel to that of the fixed layer 28, and is a maximum when the magnetization of layer 24 is antiparallel that of the fixed layer 28.

It will now be seen that the spin valve cell configuration of the storage element 20 achieves the previously stated objectives. Since the two states correspond to the maximum and minimum DC resistance due to the spin valve effect, the DC resistance can be detected and used directly for readout. No state interrogation is required, and a nondestructive readout is guaranteed.

The total $\delta R/R$ of the magnetic layers 24, 28 is utilized. For example, assume a typical spin valve structure of NiFe(90 Å)/Cu(20 Å)/NiFe(70 Å)/MnFe(120 Å) and $\delta R/R$ of 3.6% and a R of 20 $\Omega/cm^2$. With a storage element having a width of 1 $\mu$m, length of 5 $\mu$m, and a sense current of 5 mA, the signal level is about 18 mV, which is high enough to permit high speed real time detection and use in a one-megabit storage device. Further improvement can be achieved by reducing the cell size even more.

With applicants' invention, there is no Barkhausen noise problem or linearity requirement. Materials, such as Co or other Co alloys, with high anisotropy/coercivity could enhance the stability of the storage element and increase the sensitivity two or three times.

Figure 3:
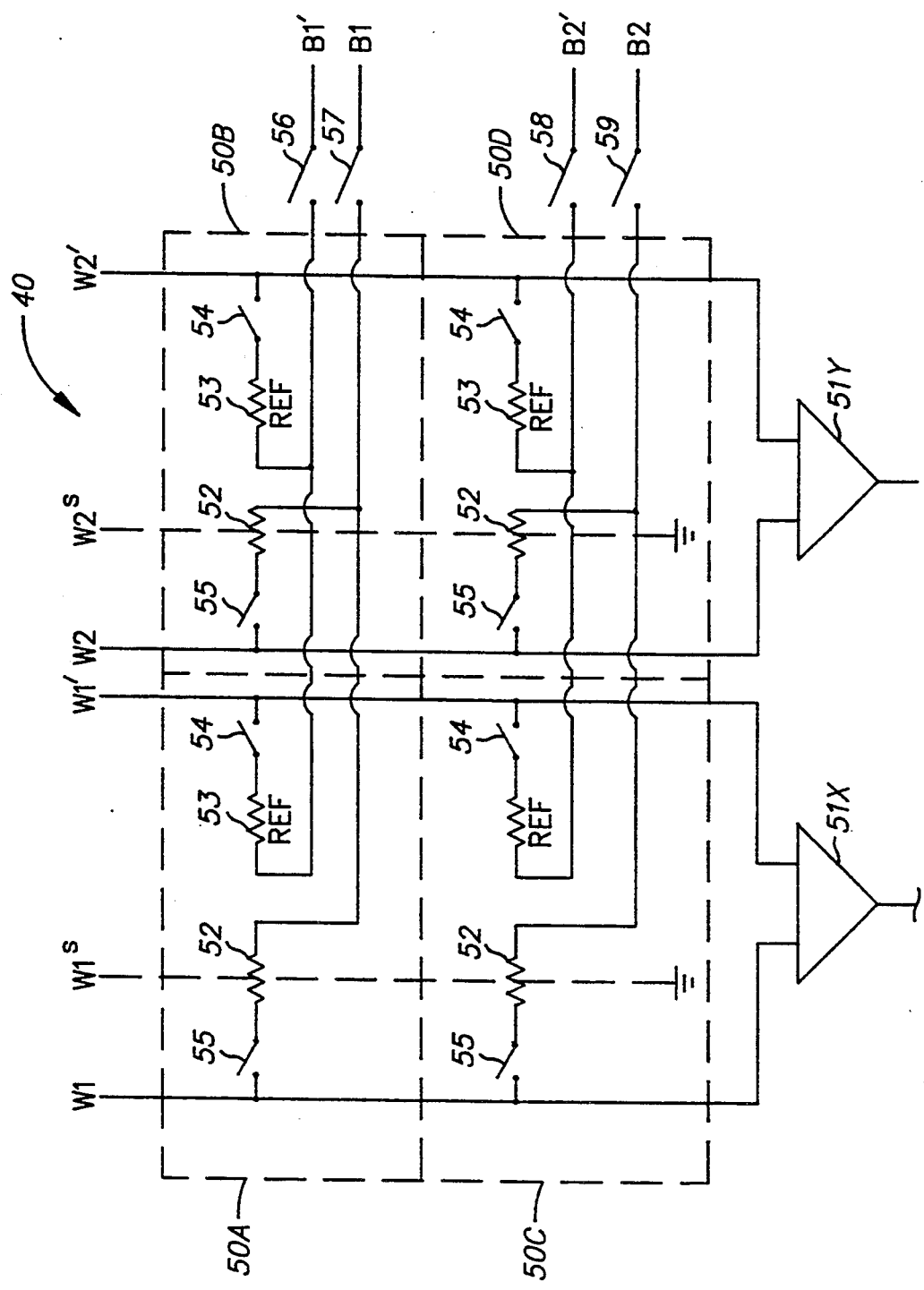
FIG. 3 is schematic diagram of a 2×2 MR storage array depicting one implementation of the invention.

FIG. 3 depicts storage cell selection circuitry for effecting read and write operations in a 2×2 storage array 40 embodying the invention. As illustrated, the array 40 comprises four identical storage cells 50A, 50B, 50C, and 50D, and two sense amplifiers 51X, 51Y. Each cell, 50A–D, comprises an active MR storage element 52 and a reference MR storage element 53 to provide a differential output. To prevent shunting of a signal across the array, each storage element 52, 53, is energized by two sets of switches. For example, to write into cell 50A, switches 55 of cell 50A and 57 are closed, so that lines B1 and W1 are connected to allow write current (32, FIG. 2) flow through MR element 52 to induce a transverse field; and write line W1$^s$ is connected to ground to allow current flow to induce a longitudinal field. To read the content of cell 50A, switches 55 of cell 50A and 57 are closed to connect lines B1 and W1, and switches 54 of cell 50A and 56 are closed to connect lines B1' and W1' to allow sense current into both the active element 52 and the reference element 53 of cell 50A and their differential output is sensed by amplifier 51X as a differential output voltage.

It will thus be apparent that to write into cell 50B, close switches 55 of cell 50B and 54 and activate write current in W2$^s$; to write into cell 50C, close switches 55 of cell 50C and 59 and activate write current in W1$^s$; etc. To read out the content of cell 50B into amplifier 51Y, close switches 55 of cell 50B and 57 to connect lines B1 and W2, and close switches 54 of cell 50B and 56 to connect lines B1' and W2'; to read out the content of cell 50C into amplifier 51X, close switches 55 of cell 50C and 59 to connect B2 to W1, and close switches 54 of cell 50C and 58 to connect B2' to W1'; etc. Thus the combination of the two fields directed to a selectable one of the cells 50A–D will induce switching in only the selected cell.

Figure 4:
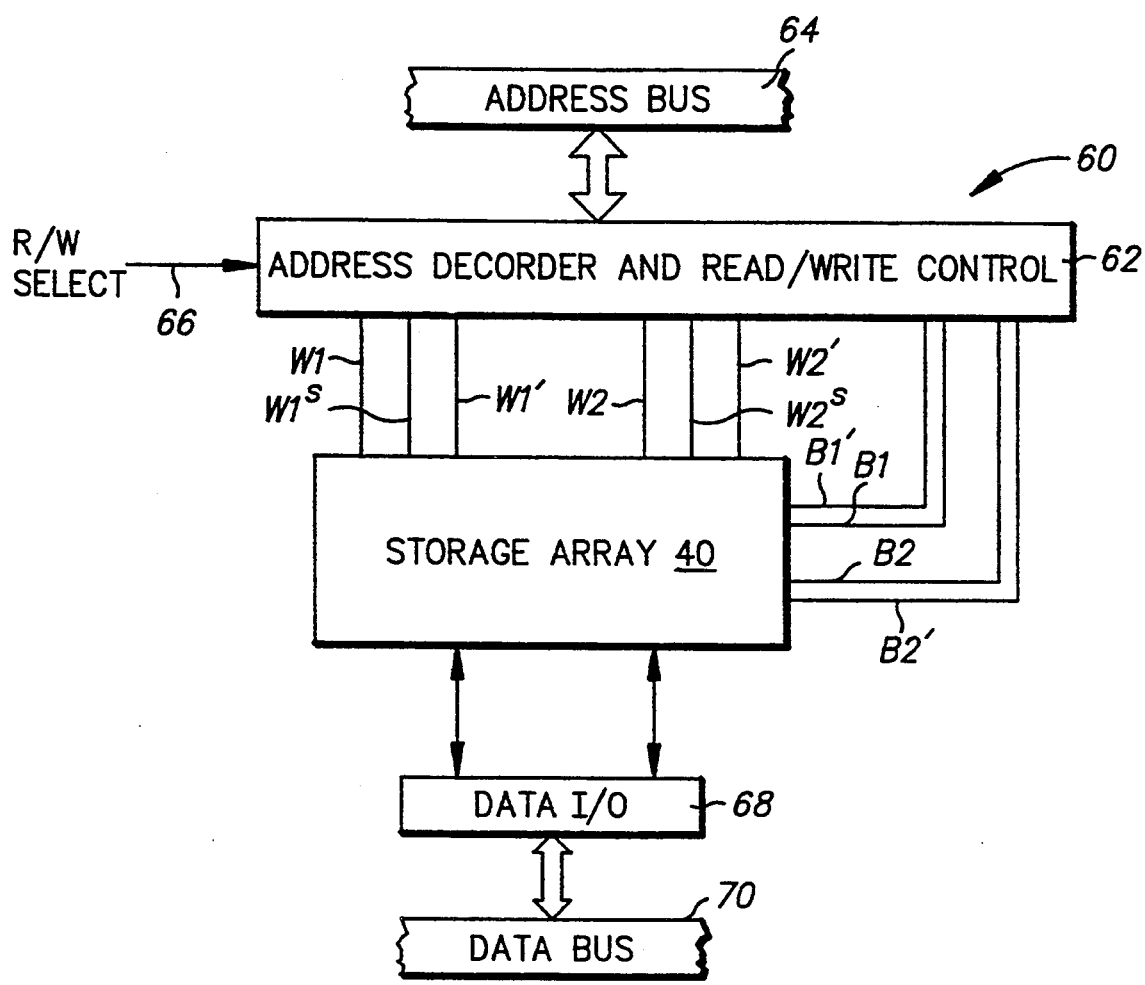
FIG. 4 is a schematic diagram of a storage device embodying the storage array illustrated in FIG. 3.

FIG. 4 depicts a storage device 60 embodying the storage cell array 40 shown in FIG. 3. When address bus 64 feeds an address to address decoder 62, the decoder will activate the switches in the selected word lines and bit lines, so that a particular one of the cells 50–AD in the storage cell array 40 is selected. If a read signal is transmitted via read/write select line 66, the content of the selected cell is interrogated and moved into the data I/O 68, and later transmitted to data bus 70. When a write command is received via read/write select line 66, the address decoder read/write control 62 will activate the switches and send a proper write current to the particular cell selected according to the information in data I/O 68 for writing data into that selected cell.

While the invention has been shown and described with reference to a preferred embodiment thereof, it will be understood by those skilled in the art that various changes in form and detail may be made therein without departing from the spirit and scope of the invention. Therefore, the invention is not to be limited except as proscribed by the claims.

What is claimed is:

1. A nonvolatile magnetoresistive storage element comprising a substrate and a rectangular multilayered structure deposited thereon and including two layers of ferromagnetic material separated by a layer of nonmagnetic metallic conducting material, the magnetization easy axis of both ferromagnetic layers being oriented substantially lengthwise of the storage element, the magnetization of one of the ferromagnetic layers being fixed in one direction substantially lengthwise of the storage element, and the magnetization of the other ferromagnetic layer being free to change direction between substantially parallel and substantially antiparallel to said fixed one direction in response to an applied magnetic field.

2. The storage element of claim 1, wherein the width of the storage element is less than the width of magnetic domain walls of the layers of the multilayered structure.

3. The storage element of claim 1, including means for applying magnetic fields to the storage element for switching it between two states representing a "1" or a "0" according to whether the magnetization directions of the ferromagnetic layers are parallel or antiparallel, respectively.

4. The storage element of claim 1, wherein the width of each storage element is less than the length of the storage element by an amount sufficient to ensure that said other layer will remain in a selected domain state.

5. The storage element of claim 1, wherein the electrical resistance is at a minimum or a maximum according to whether the magnetization of said other layer is substantially parallel or substantially antiparallel, respectively, to the magnetization of said one layer.

6. The storage element of claim 1, including an antiferromagnetic layer for magnetizing said one layer in said fixed one direction by exchange coupling.

7. The storage element of claim 1, wherein said one layer is of a hard magnetic material having greater coercivity than the coercivity of said other layer.

8. The storage element of claim 1, wherein said one layer has sufficiently high anisotropy to retain its magnetization during state switching operations.

9. A nonvolatile magnetoresistive storage array comprising:
a plurality of spin valve cells, each comprising an active storage element of the type defined in claim 1; and
means for supplying a transverse write current to an active storage element in a selectable one of the cells for inducing a transverse magnetic field, and concurrently supplying to the selected cell a longitudinal write current for inducing a longitudinal magnetic field, for thereby writing a "1" or a "0" in the selected cell according to whether the magnetization directions of the ferromagnetic layers of said active storage element are substantially parallel or substantially antiparallel, respectively.

10. The array of claim 9, including a separate conductor interposed between the substrate and other layer and extending lengthwise through the storage elements for supplying additional transverse write current to the selected active storage element to increase stability.

11. A nonvolatile magnetoresistive storage array comprising:
a plurality of spin valve cells, each comprising an active storage element and a reference storage element each of the type defined in claim 1;
at least one differential amplifier; and
means for supplying sense current via the active and reference elements of a selectable one of the cells to an associated amplifier to provide a differential output voltage of a magnitude denoting the then current magnetic state of the selected cell.

12. A nonvolatile magnetoresistive storage array comprising:
a plurality of spin valve cells, each comprising an active storage element and a reference storage element each of the type defined in claim 1;
at least one differential amplifier;
means for supplying sense current via the active and reference elements of a selectable one of the cells to an associated amplifier to provide a differential output voltage of a magnitude denoting a current magnetic state of the selected cell; and
means for applying to a desired one of the cells a write current that flows in a direction orthogonal to the direction of the sense current while concurrently supplying thee sense current solely to the active element of the desired cell, for storing data in the desired cell.

13. The array of claim 11, wherein the sense current induces a transverse magnetic field and the write current induces a longitudinal magnetic field, for thereby writing a "1" or a "0" in the selected cell according to whether the magnetization directions of the ferromagnetic layers of said active storage element are substantially parallel or substantially antiparallel, respectively.

14. A nonvolatile magnetoresistive (MR) storage device comprising:
a plurality of MR storage elements, each comprising a substrate and a multilayered structure including two thin film layers of ferromagnetic material separated by a thin layer of nonmagnetic metallic conducting material, the magnetization easy axis of both ferromagnetic layers in each storage element being oriented substantially lengthwise of said storage elements and substantially parallel to the direction of an applied sense current, the magnetization direction of one of said ferromagnetic layers being fixed in a direction substantially lengthwise of the storage elements, and the magnetization direction of the other layer being free to switch between two digital states in which the magnetization is substantially parallel or substantially antiparallel to the magnetization direction in said one layer, each storage element having a width less than its length by an amount sufficient to ensure that said other layer will remain in a selected one of said two digital states;
means for producing a write current flow to switch a selectable one of said storage elements from one of said states to an opposite state for writing data; and
means for applying the sense current to sense the state then existing in a selectable storage element for reading the data therein.

15. A nonvolatile magnetoresistive (MR) storage device comprising:
a storage array comprising a plurality of MR spin valve cells, each cell comprising a substrate and a multilayered structure including two thin film layers of ferromagnetic material separated by a thin layer of nonmagnetic metallic conducting material, the magnetization easy axis of both ferromagnetic layers in each cell being oriented substantially lengthwise of said cells and substantially parallel to the direction of an applied sense current, the magnetization direction of one of said ferromagnetic layers being fixed in a direction substantially lengthwise of the cells, and the magnetization direction of the other layer being free to switch between two digital states in which the magnetization is substantially parallel or substantially antiparallel to the magnetization direction in said one layer, each storage element having a width less than its length by an amount sufficient to ensure that said other layer will remain in a selected one of said two digital states;

means for producing a write current flow to switch a selectable one of said storage elements from one of said states to an opposite state for writing data; and means for applying the sense current to sense the state then existing in a selectable storage element for reading the data therein;

an address bus;

an address decoder and read/write control means interposed between and connected to said address bus and said storage array;

a data I/O device connected to said storage array and data bus; and a read/write select line for selectively conveying read and write signals to said decoder and read/write control means, for conditioning the latter, (i) in response to a read signal, to interrogate the data in a selected cell corresponding to an address received from the address bus and condition said array to enter said data into the data I/O device, and (ii) in response to a write signal, to condition said array to cause the be written into a selected cell data corresponding to data received from the data I/O device.

* * * * *